United States Patent
Makarov et al.

(10) Patent No.: US 7,901,508 B2
(45) Date of Patent: Mar. 8, 2011

(54) METHOD, SYSTEM, AND APPARATUS FOR THE GROWTH OF SIC AND RELATED OR SIMILAR MATERIAL, BY CHEMICAL VAPOR DEPOSITION, USING PRECURSORS IN MODIFIED COLD-WALL REACTOR

(75) Inventors: Yuri Makarov, Richmond, VA (US); Michael Spencer, Ithaca, NY (US)

(73) Assignee: Widetronix, Inc. DE (US)

( * ) Notice: Subject to any disclaimer, the term of this patent is extended or adjusted under 35 U.S.C. 154(b) by 30 days.

(21) Appl. No.: 11/626,387

(22) Filed: Jan. 24, 2007

(65) Prior Publication Data

US 2008/0173242 A1 Jul. 24, 2008

(51) Int. Cl.
C30B 21/02 (2006.01)
(52) U.S. Cl. .................... 117/200; 117/900; 118/715
(58) Field of Classification Search .............. 117/89, 117/93, 200, 900; 438/680, 778; 118/715; 427/250
See application file for complete search history.

(56) References Cited

U.S. PATENT DOCUMENTS

| | | | |
|---|---|---|---|
| 4,228,142 A | 10/1980 | Holcombe, Jr. | |
| 4,952,715 A | 8/1990 | Blum | |
| 5,008,422 A | 4/1991 | Blum | |
| 5,055,431 A | 10/1991 | Blum | |
| 5,204,314 A | 4/1993 | Kirlin | |
| 5,322,913 A | 6/1994 | Blum | |
| 5,536,323 A | 7/1996 | Kirlin | |
| 5,593,783 A | 1/1997 | Miller | |
| 5,789,024 A | 8/1998 | Levy | |
| 5,792,416 A | 8/1998 | Sacks | |
| 5,851,942 A | 12/1998 | Sacks | |
| 6,482,262 B1 | 11/2002 | Elers | |
| 6,660,330 B2 * | 12/2003 | Locke et al. | 427/250 |
| 6,733,830 B2 | 5/2004 | Todd | |
| 6,783,589 B2 | 8/2004 | Dahl | |
| 6,800,552 B2 | 10/2004 | Elers | |
| 6,821,825 B2 | 11/2004 | Todd | |
| 6,830,822 B2 | 12/2004 | Yadav | |
| 6,849,109 B2 | 2/2005 | Yadav | |
| 6,878,628 B2 | 4/2005 | Sophie | |
| 6,958,253 B2 | 10/2005 | Todd | |
| 6,982,230 B2 | 1/2006 | Cabral | |
| 6,984,591 B1 | 1/2006 | Buchanan | |
| 6,989,428 B1 | 1/2006 | Bianconi | |
| 7,061,073 B2 | 6/2006 | Dahl | |
| 7,247,513 B2 | 7/2007 | Kordina | |
| 2002/0042192 A1 * | 4/2002 | Tanaka et al. | 438/485 |

* cited by examiner

Primary Examiner — Robert M Kunemund
(74) Attorney, Agent, or Firm — MaxvalueIP LLC

(57) ABSTRACT

An approach for the growth of high-quality epitaxial silicon carbide (SiC) films and boules, using the Chemical Vapor Deposition (CVD) technique is described here. The method comprises modifications in the design of the typical cold-wall CVD reactors, providing a better temperature uniformity in the reactor bulk and a low temperature gradient in the vicinity of the substrate, and an approach to increase the silicon carbide growth rate and to improve the quality of the growing layers, using halogenated carbon-containing precursors (carbon tetrachloride $CCl_4$ or halogenated hydrocarbons, $CHCl_3$, $CH_2Cl_2$, $CH_3Cl$, etc.), or introducing other chlorine-containing species in the gas phase in the growth chamber. The etching effect, proper ranges, and high temperature growth are also examined.

9 Claims, 1 Drawing Sheet

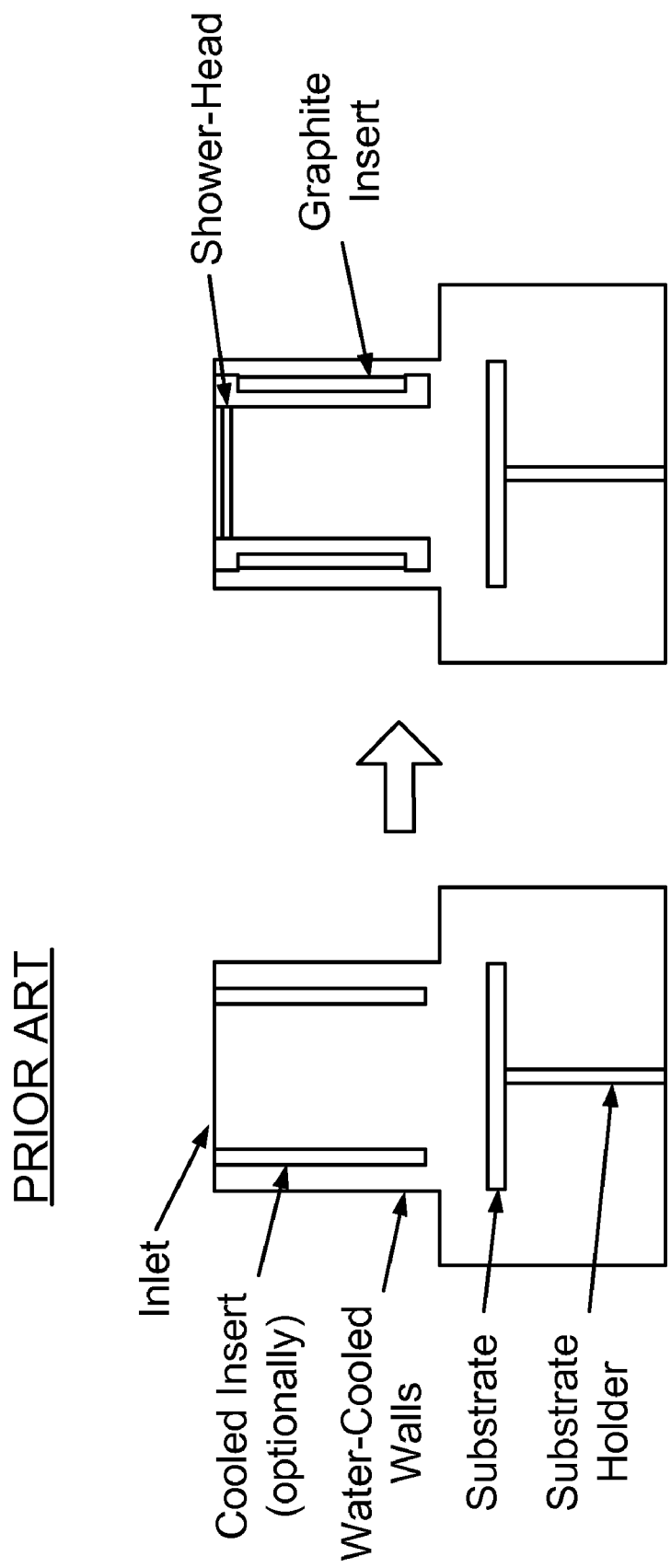

METHOD, SYSTEM, AND APPARATUS FOR THE GROWTH OF SIC AND RELATED OR SIMILAR MATERIAL, BY CHEMICAL VAPOR DEPOSITION, USING PRECURSORS IN MODIFIED COLD-WALL REACTOR

CROSS-REFERENCE TO A RELATED APPLICATION

This application is related to another co-pending US application filed on the same day, with same title, inventors, and assignee, with Ser. No. 11/626,388.

BACKGROUND

A novel approach for the growth of high-quality epitaxial silicon carbide (SiC) films and boules using the Chemical Vapor Deposition (CVD) technique is described here, as one embodiment. The method comprises:
- modifications in the design of the typical cold-wall CVD reactors, providing a better temperature uniformity in the reactor bulk and a low temperature gradient in the vicinity of the substrate;
- an approach to increase the silicon carbide growth rate and to improve the quality of the growing layers, using halogenated carbon-containing precursors (carbon tetrachloride $CCl_4$ or halogenated hydrocarbons, $CHCl_3$, $CH_2Cl_2$, $CH_3Cl$, etc.), or introducing other chlorine-containing species in the gas phase in the growth chamber.

Some of the prior art dealing with this or similar technology are listed here (US patent number and its title):

U.S. Pat. No. 7,061,073, Diamondoid-containing capacitors,

U.S. Pat. No. 6,989,428, Methods of preparing polysilynes,

U.S. Pat. No. 6,984,591, Precursor source mixtures,

U.S. Pat. No. 6,982,230, Deposition of hafnium oxide and/or zirconium oxide, and fabrication of passivated electronic structures, U.S. Pat. No. 6,958,253, Process for deposition of semiconductor films, U.S. Pat. No. 6,878,628, In-situ reduction of copper oxide prior to silicon carbide deposition, U.S. Pat. No. 6,849,109, Inorganic dopants, inks, and related nanotechnology, U.S. Pat. No. 6,830,822, Inorganic colors and related nanotechnology, U.S. Pat. No. 6,821,825, Process for deposition of semiconductor films, U.S. Pat. No. 6,800,552, Deposition of transition metal carbides, U.S. Pat. No. 6,783,589, Diamondoid-containing materials in microelectronics, U.S. Pat. No. 6,733,830, Processes for depositing low dielectric constant materials, U.S. Pat. No. 6,482,262, Deposition of transition metal carbides, U.S. Pat. No. 5,851,942, Preparation of boron-doped silicon carbide fibers, U.S. Pat. No. 5,792,416, Preparation of boron-doped silicon carbide fibers, U.S. Pat. No. 5,789,024, Subnanoscale composite, N2-permselective membrane for the separation of volatile organic compounds, U.S. Pat. No. 5,593,783, Photochemically modified diamond surfaces, and method of making the same, U.S. Pat. No. 5,536,323, Apparatus for flash vaporization delivery of reagents, U.S. Pat. No. 5,322,913, Polysilazanes and related compositions, processes, and uses, U.S. Pat. No. 5,204,314, Method for delivering an involatile reagent in vapor form to a CVD reactor, U.S. Pat. No. 5,055,431, Polysilazanes and related compositions, processes, and uses, U.S. Pat. No. 5,008,422, Polysilazanes and related compositions, processes, and uses, U.S. Pat. No. 4,952,715, Polysilazanes and related compositions, processes, and uses, and U.S. Pat. No. 4,228,142, Process for producing diamond-like carbon.

Other prior results are summarized in the following references:

Y. Gao, J. H. Edgar, J. Chaudhari, S. N. Cheema, M. V. Sidorov, D. N. Braski, Journ. Cryst. Growth 191, 439 (1988).

J. Chaudhari, K. Ignatiev, J. H. Edgar, Z. Y. Xie, Y. Gao, Z. Rek, Mater. Sci. Eng. B76, 217, (2000).

S. Jonas, C. Paluszkiewicz, W. S. Ptak, W. Sadowski, J. Molec. Structure 349, 72 (1995).

F. Loumagne, F. Langlais, R. Naslain, J. Cryst. Growth 155, 205, (1995).

C.-F. Wang, D.-S. Tsai, Materials Chemistry and Physics 63, 196, (2000).

H. Sone, T. Kaneko, N. Miyakawa, Journ. Cryst. Growth 219, 245 (2000).

Y.-P. Wu and Y.-S. Won, Combustion and Flame 122, 312 (2000).

However, none of the prior art teaches the features of the current invention.

SUMMARY

In this system, we present the following:

1. A device for the improvement of temperature distributions in the typical commercial cold-wall CVD reactors, which includes, but not limited to:

an addition of the refractory insert in the reactor, to get more uniform temperature distribution and to decrease the temperature gradient in the vicinity of the substrate. Possible materials for such an insert are graphite, SiC-coated graphite, graphite coated with carbides of refractory metals (tantalum, niobium, titanium, tungsten, molybdenum, zirconium, hafnium, etc.), carbides of the refractory metals listed above, quartz or quartz coated with refractory metals (molybdenum, tungsten, niobium, etc.), or pure refractory metals listed above; and an addition of the showerhead unit near the inlet of the typical commercial cold-wall reactor, which increases the temperature in the inlet region and improves the flow patterns in the reactor. The construction materials for this unit are the same as for the insert, described in the paragraph above.

2. A method of SiC layer CVD growth, wherein the increase in silicon carbide growth rate and in the epilayer quality are achieved by using input gas mixture containing silicon and carbon species, along with chlorine-containing components with optimal silicon-to-carbon and silicon-to-chlorine ratios. This approach can be realized using halogenated carbon precursors (carbon tetrachloride $CCl_4$ or halogenated hydrocarbons, $CHCl_3$, $CH_2Cl_2$, $CH_3Cl$, etc.), or introducing other chlorine-containing species in the gas phase of the growth chamber.

Increase in SiC growth rate, along with the improvement of the growing layer quality, are achieved under the following silicon-to-carbon and silicon-to-chlorine ratios (range of values):

$$x^{(int)}(Si)/x^{(int)}(C)=0.7-1.3,$$

$$x^{(int)}(Si)/x^{(int)}(Cl)=0.02-1.5,$$

where $x^{(int)}(Si)/x^{(int)}(Cl)$, $x^{(int)}(Cl)$ are the number of silicon, carbon, and chlorine atoms in the input gas mixture, respectively.

Note that for all the discussions in this patent application, the ranges (such as those mentioned above) are approximate ranges/values, and any value close to those ranges (but outside those ranges) would also be considered included and protected under this current patent. That is, for the numbers outside the ranges, but in close proximity (e.g. in the same order of magnitudes, or relatively similar values), the system may not work in optimum conditions, but still produces excellent results. In other words, the boundaries of the ranges are not sharply defined, as absolute cut-off values or thresholds. Instead, they are gradually changed, and they are meant to be as guidelines for focusing on the optimum values, and, still, for other outside close-by values, ranges, or regions, the system is producing good or excellent material and results, as well. (This above discussion applies to all ranges mentioned in the current patent application.)

An etching effect, decreasing the net SiC growth rate, can be expected at $x^{(int)}(Si)/x^{(int)}(Cl)<0.66$.

In contrast to the conventional SiC growth from silane ($SiH_4$) and propane ($C_3H_8$), some basic mechanisms of the process are changed, as a result of presence of chlorine atoms in the gas phase in a certain optimal amount. First, $SiCl_2$ becomes the major source providing Si for SiC growth, instead of $SiH_2$ and Si in the conventional approach. Second, the formation of silicon clusters and particles in the gas phase is suppressed by chlorine-containing species under the above process conditions. These effects give rise to an increase in the net growth rate, and improve the quality of the grown layers.

3. A method for reducing the growth temperatures from the existing >1500° C. to below 1500° C. (in the range 1000 to 1500° C.). The lower growth temperature is achieved by the addition of halogenated carbon precursors or other chlorine-containing additions, to provide the above mentioned chlorine-to-silicon and silicon-to-carbon ratios:

$$x^{(int)}(Si)/x^{(int)}(C)=0.7-1.3,$$

$$x^{(int)}(Si)/x^{(int)}(Cl)=0.02-1.5.$$

It is well-known that silicon carbide growth rate decreases with the temperature decrease for the growth conditions (total pressure range, input precursor flow rates, reactor geometry, etc.) typical for the process. However, epitaxial layers grown at low temperatures (see e.g. A. Itoh and H. Matsunami, IEEE Electron Device Lett. 16, 280, (1995)) (describing SiC epilayer growth at temperatures below 1200° C.) are characterized by perfect epilayer quality. So, there is a need to increase SiC growth rate at low temperatures to produce perfect SiC epilayers, effectively. The above mentioned addition of chlorine-containing species increases the net SiC growth rate due to mechanisms described here. As a result, the process temperature can be significantly decreased.

The capability to grow SiC epitaxial layers below 1500° C. allows the growth of Silicon Carbide epitaxial layers on composite substrates that may comprise of Silicon substrates, coated with a thin film of monocrystalline SiC.

4. A method of suppressing parasitic deposits on the susceptor, reactor walls, and injector system. Parasitic deposits forming at the reactor units during SiC growth are known to be one of the main technical problems in the process. Indeed, silicon, carbon, SiC, or mixed Si—SiC/C—SiC solid phases can be generated on the walls of the injector unit, susceptor and susceptor holder, reactor walls, etc. This negative effect leads to the losses in the source material for SiC growth, deviations in the gas composition and flow characteristics during the process, and/or changes in the injector geometry. In turn, it results in the variations in SiC growth rate, stoichiometry, and the quality of the growing layers. Due to its etching effect, chlorine addition in the system at the following silicon-to-carbon and silicon-to-chlorine ratios will suppress parasitic deposits formation:

$$x^{(int)}(Si)/x^{(int)}(C)=0.7-1.3,$$

$$x^{(int)}(Si)/x^{(int)}(Cl)=0.02-1.5,$$

This follows from the fact that chlorine interaction with the above listed deposit phases, in hydrogen ambience, results in the formation of volatile $CH_iCl_j$ and $SiH_iCl_j$ species. Hence, parasitic deposits will be effectively etched, and volatile products of this etching will return silicon and carbon as source materials for SiC growth.

5. In some applications, to get high quality material, we have used high temperatures, in the range of 1500-1800 Centigrade, with an excellent material characteristics.

BRIEF DESCRIPTION OF THE DRAWINGS

FIG. 1. (a) A typical (prior art) design of the commercial cold-wall CVD reactors; and (b) the modified reactor design with the heat shielding insert and graphite showerhead, according to an embodiment of this invention.

DETAILED DESCRIPTION OF THE PREFERRED EMBODIMENTS

The superior properties of silicon carbide as compared with silicon make it a perspective material for high power and high-temperature electronics (high-power transistors, thyristors, and rectifiers). Due to an extremely high thermal conductivity (3 W/cm*K for SiC vs. 1.3 for Si) and high breakdown voltage (1 MV/cm for SiC vs. 0.3 MV/cm for Si), the SiC-based device structures are capable to operate at much higher voltage and power. The wide bandgap of SiC (2.3 eV for SiC vs. 1.1 eV for Si) provides a low leakage current of the p-n junction, even at high temperatures. In addition, SiC exhibits a remarkable mechanical and chemical stability.

Despite the obvious advantages, wide-scale application of SiC in the device industry is currently hindered by essential technological difficulties arising in manufacturing of SiC-based structures of the required high quality and by their high costs. Among the tasks, the improvement of the quality of the growing epitaxial layers seems to be most important at the moment. This task includes the achievement of a good surface morphology, high thickness uniformity, an accurate stoichiometry, and a low defect density of the epilayers.

Chemical vapor deposition is conventionally used to grow the epitaxial SiC films. Among the devices used in this technique, cold-wall CVD reactors provide the low-cost and effective process of SiC growth, as compared with other systems. The typical design of a cold-wall CVD reactor includes a single heater or some heater system, to achieve the uniform high temperature at the susceptor and in the vicinity of it, and the injector system, reactor walls, and outlet unit are usually kept at a low temperature. Generally, the reactor geometry varies by a wide range—horizontal, vertical, barrel, shower-head pyramid, etc. (see, for example, the information on the commercial AIXTRON or Veeco cold-wall CVD reactors for more details, by their respective manufacturers).

However, some technical problems are typical for these systems. First, the high temperature gradient in the vicinity of the substrate is inevitable in this technique. This leads to the decrease in the quality of the growing film, due to the strain produced by a thermal expansion mismatch between the substrate and the growing epilayer, which is known to be the general source for defect generation in the growing layer. As a result, the silicon carbide layer would be low quality. The effective way to minimize this mismatch, and to improve the film quality, is to decrease the growth temperature, but this will significantly decrease the SiC growth rate, making the process less effective and more expensive.

The increase in the input precursor flow rates (silane and propane or acetylene typically used in the CVD of SiC) can be suggested as a way to increase the growth rate. Unfortunately, this will increase the partial pressures of silicon-containing species in the reactor. In turn, this effect gives rise to the formation of silicon clusters in the gas phase. As known from experiments, silicon particles in the gas phase lead to the decrease in the epilayer quality, due to the boulders or wavy effect on the surface (particles on the surface can be also observed). In addition, silicon nucleation leads to the losses in the source material for silicon carbide growth, which decreases the net SiC growth rate and distorts the stoichiometry of the growing layer.

Silicon nucleation can be partially suppressed via the decrease in the percentage of silicon-containing species in the reactor, using the increased flow rates of the carrier gas (usually hydrogen). Another approach is to decrease the total pressure in the reactor, in order to minimize the partial pressures of silicon-containing species. Unfortunately, these methods lead to the high gas flows that require more expensive pumps and manifolds. In addition, etching by hydrogen is significant at high hydrogen concentrations. As a result, the decrease in SiC growth rate and the destruction of the construction materials (due to the interactions with hydrogen) can be expected.

Another problem typical for cold-wall CVD reactors is poor temperature uniformity in the growth chamber. As is well-known, the main sources for the SiC growth are the products of thermal decomposition of the initial precursors (silane and propane or acetylene), which occurs at temperatures above 800-850° C. The region with such a temperature in a cold-wall reactors is localized near the substrate. It is relatively small, as compared with the whole reactor volume. So, the significant part of the initial precursors can remain un-decomposed. Obviously, this effect will manifest itself at increased input precursor flow rates. In turn, this will also decrease the silicon carbide growth rate.

Attempts to reduce silicon nucleation and to improve the SiC layer quality using the chlorine-containing silicon precursors (chlorosilanes) or adding a chlorine-containing etching agent (e.g. HCl) in the gas were carried repeatedly. The above approach was suggested in the disclosure for US patent application 20040222501, Serial No. 431819, by O. Kordina. However, HCl is a fairly reactive compound, and its addition requires a special separate manifold line. These modifications are rather expensive. In addition, chlorosilanes decomposition requires temperatures above 800-950° C., and even higher temperatures are necessary to provide the suppression of silicon nucleation by chlorine-containing species. So, the application of the above approach in the cold-wall CVD reactors is strictly limited by the fact that the "hot zone" in these reactors is rather small.

Our method differs from the above patents/prior art with respect to the following terms and parameters:

(i) The specific range of silicon-to-carbon and chlorine-to-silicon ratios:

$$x^{(int)}(Si)/x^{(int)}(C)=0.7-1.3,$$

$$x^{(int)}(Si)/x^{(int)}(Cl)=0.02-1.5;$$

(ii) Halogenated carbon precursors (carbon tetrachloride $CCl_4$ or halogenated hydrocarbons, $CHCl_3$, $CH_2Cl_2$, $CH_3Cl$, etc.) are primarily considered as chlorine-containing species, forming the gas composition mentioned above;

(iii) Suppression of parasitic deposits due to the etching by chlorine-containing species is considered as one of the mechanisms providing the increase in SiC growth rate and layer quality;

(iv) Modifications in the reactor design are suggested, which makes the chlorine addition really effective in the cold-wall reactors;

(v) Effective SiC growth process at temperatures as low as 1000° C. is possible;

(vi) SiC growth on on-axis surfaces is provided, due to the effective etching of silicon clusters at Si/Cl ratios of <0.66, which are known as a main source of undesirable cubic SiC phase, typical for the on-axis growth in the conventional approach.

Accordingly, a need exists to increase the temperature uniformity, to minimize the temperature gradient near the substrate in the commercial cold-wall reactors, and to suppress silicon nucleation, to get high SiC growth rates at higher precursor input flow rates and lower carrier gas flow, maintaining high crystal quality.

Typical commercial cold-wall CVD reactors are characterized by rather non-uniform temperature distributions in the growth chamber. The "hot zone" with the temperatures above 800° C. (necessary for an onset of silane and propane thermal decomposition) is localized near the substrate, and is rather small, as compared with the whole reactor bulk. A graphite or SiC-coated graphite insert arranged near the cold walls of the upper part of the reactor (that acts as a temperature shield) (see the design modifications in FIG. 1) is an effective way to improve the temperature distribution in those types of reactors. Some alternative construction materials can be also used for such an insert. For example, they are: graphite coated with carbides of refractory metals (tantalum, niobium, titanium, tungsten, molybdenum, zirconium, hafnium, etc.); carbides of the refractory metals listed above; quartz or quartz coated with above refractory metals or their carbides; pure refractory metals listed above; or any other material, alloy, or mixture having same or similar properties.

The insert walls in such a design are heated by the radiation flux from the heated substrate. The high thermal conductivity of the graphite provides the effective and uniform heating of the whole insert. A special design of the insert fixation gives the opportunity to minimize the contact area between the insert and the water-cooled reactor units, and to vary the gap between the insert and the top flange of the reactor. In doing so, the cooling effect of the reactor units on the temperature of the insert walls is minimized Since the temperature of the insert wall in such a modified reactor became quite higher than the temperature of the water-cooled units, the temperature of the gas in the reactor bulk is increased.

However, the above modifications in the reactor design can be insufficient for some operating regimes, due to the effect of the cooled inlet. So, the showerhead, made from the refractory materials listed above, can be optionally added to increase the temperature near the reactor inlet. Note that this unit also provides an additional improvement of the flow patterns in the reactor and more uniform species delivery. The scheme of the suggested modifications in the typical design of cold-wall CVD reactors is depicted in FIG. 1. FIG. 1 is (a) a typical design of the commercial cold-wall CVD reactors, and (b) the modified reactor design, with the heat shielding insert and graphite showerhead.

As an example, one embodiment demonstrates the geometry of the graphite insert with the showerhead applied in the cold-wall reactor. The described modifications in the reactor design result in significant improvement of the temperature distributions in the reactor. For example, typical cold-wall reactor with and without modifications was tested in the following basic regime of SiC CVD: substrate temperature=1600° C.; total pressure=200 Torr; rotation rate=1000 rpm; main hydrogen flow rate=12500 sccm; reactant push flow rate=1500 sccm; pyrometer opening purge=550 sccm; and silane and propane diluted in hydrogen input flow rates were varied during the runs (the typical values of the input flows were hundreds cc). One embodiment indicates the general changes in the temperature distributions obtained as a result of the modifications in the reactor design. The temperature distributions in a modified reactor are more uniform. We emphasize that the "hot zone" with the temperature of ~800° C. is significantly enlarged in the modified reactor. The increase in the average inlet temperature here can be estimated as being more than 350-400° C. As a result, thermal decomposition of the precursors used for SiC CVD takes place in the whole reactor volume, providing the optimal utilization of the source materials in the process. This gives an opportunity to increase the SiC growth rate in a modified reactor at the same or even lower precursor input flow rates. Thus, the effectiveness of the process can be increased.

The temperature gradient near the substrate decreases from $7.2*10^4$ K/m for the initial cold wall design to $4*10^4$ K/m in the modified geometry. Further optimization of the operating conditions gives the opportunity to get this value to about $1.7-2*10^4$ K/m. Obviously, such a significant decrease in the temperature gradient will decrease the strain produced by a thermal expansion mismatch between the substrate and the growing epilayer, which is known to be the main source for defect generation in a growing SiC layer. So, we believe that the suggested modifications will improve the quality of the epitaxial SiC layers, due to the minimization of the defects generation in the growing layer and increase the growth rate via the optimal utilization of the source materials.

One embodiment shows the improvement of the uniformity in the temperature distributions, as a result of the design modifications in the reactor. As it follows from the other research data, the addition of the chlorine-containing species in the gas phase during SiC CVD can suppress or completely eliminate silicon nucleation. Two approaches were suggested: HCl addition in the input gas flow and the use of chlorosilanes (chloromethylsilanes) as precursors. Our experiments support these data.

As an example, one embodiment demonstrates the relative decrease in the silicon cluster mass density in the region near the substrate, estimated for the typical reactor under the following operating conditions: substrate temperature=1600° C.; total pressure=200 Torr; silane flow rate=65 sccm (10% in hydrogen); propane flow rate=96.8 sccm (2% in hydrogen); rotation rate=1000 rpm; main hydrogen flow rate=12500 sccm; reactant push flow rate=1500 sccm; and pyrometer opening purge=550 sccm. One can see that the chlorine effect manifests itself immediately upon the HCl addition. Small amounts of HCl provide the sharp decrease in the mass density of silicon clusters. The silicon cluster density is expected to be less than 15-20% of the initial value, when the integral molar percentage of silicon-containing species is approximately the same as that of chlorine-containing species. However, the complete elimination of silicon clusters became possible at rather high HCl input flow rates. As a result of silicon nucleation suppression, the SiC growth rate increased from ~2-2.2 to 5-6 microns/hour.

However, the addition of HCl in the input flow requires a separate input pipeline, so the input system became more complicated and expensive. In addition, the compound is fairly reactive. For this reason, the use of halogenated carbon precursors (carbon tetrachloride $CCl_4$ or halogenated hydrocarbons, $CHCl_3$, $CH_2Cl_2$, $CH_3Cl$, etc.) is a reasonable alternative to HCl addition. As it was shown above, the significant suppression of silicon nucleation is observed, even at low chlorine percentage in the gas.

One embodiment shows the mechanisms of silicon nucleation suppression in Si—C—H—Cl gas. (One embodiment shows the comparison of the general mechanisms of the gas-phase chemistry during SiC growth for the conventional approach (growth from silane and propane), versus our method of growth, in Si—C—H—Cl ambience.) It compares the general schemes of precursor decomposition in the conventional CVD of SiC from silane and propane versus our approach. Silicon is one of the main decomposition species generated due to the silane thermal decomposition. Due to local supersaturation, gaseous silicon forms silicon clusters. As a result, there is significant loss of the source material for silicon carbide growth. The addition of the chlorine-containing agent in the gas under the process conditions discussed above (i.e. the following silicon-to-carbon and silicon-to-chlorine ratios) leads to a set of interaction reactions between the precursor decomposition products:

$$x^{(int)}(Si)/x^{(int)}(C)=0.7-1.3,$$

$$x^{(int)}(Si)/x^{(int)}(Cl)=0.02-1.5.$$

Three basic results of such interactions under the suggested process conditions are:
Silicon dichloride ($SiCl_2$), instead of silicon, is the main source of silicon for SiC growth. So, the silicon percentage is significantly lower than that in the conventional approach. As a result, silicon supersaturation is eliminated and nucleation is suppressed.
Gaseous hydrochloric acid is generated and its content can be quite high, as compared with the percentage of silicon- and carbon-containing species. Being a strong etching agent, HCl reacts with the gaseous silicon and silicon clusters forming volatile chlorides. As a result, an additional suppression of silicon nucleation is observed.
Parasitic deposits at the susceptor, injector, and reactor walls (pure carbon, silicon, silicon carbide, Si—SiC and C—SiC phases) are effectively etched, as a result of formation of volatile $CH_iCl_j$ and $SiH_iCl_j$ species. Such parasitic deposits suppression increases the stability of the process and decreases the losses in the source material.

Since the typical silicon-to-carbon input ratio in SiC CVD technologies is ~1, the integral percentages of silicon- and chlorine-containing species are comparable in the SiC CVD from silane and halogenated carbon precursors. A low temperature of the onset of thermal decomposition is an additional advantage of the suggested method (since it provides optimal precursor utilization).

One embodiment illustrates the comparison of the SiC growth rates obtained for a typical reactor using propane and carbon tetrachloride, as carbon-containing precursors, under the similar growth conditions. The only exception was the carbon-containing precursor input flow rate: For $CCl_4$, it was taken to provide the same silicon-to-carbon input ratio as for propane (Si/C=1.12).

One embodiment shows SiC growth rate in the typical reactor with propane ($C_3H_8$) and halogenated carbon precursors from the group $CCl_4$, $CH_3Cl$, $C_2Cl_2$, and $CHCl_3$. Operating conditions are: $T_{substrate}$=1600° C.; total pressure=200 Torr; silane flow rate=65 cc (10% in hydrogen); rotation rate=1000 rpm; main hydrogen flow rate=12500 cc; reactant push flow rate=1500 cc; and pyrometer opening purge=550 cc. Propane flow rate was 96.8 cc (2% in hydrogen) and the halogenated carbon precursors input flow rate was taken to maintain the same Si/C input ratio (e.g. it was 290.4 cc for $CCl_4$ (2% in hydrogen)).

The SiC growth rate increased more than twice. This effect can be attributed to the significant suppression of silicon nucleation. Indeed, the estimated mass density of silicon clusters near the substrate decreases from ~$3*10^{-5}$ kg/m$^3$ for the regime with propane to ~$4*10^{-7}$ kg/m$^3$ for $CCl_4$ (as a carbon-containing precursor). The same effect was observed for all halogenated carbon precursors tested. The slight difference in SiC growth rate is due to the peculiarities of the gas chemistry.

Thus, the possibility of the significant suppression of the silicon nucleation by using halogenated carbon precursors is proven. In turn, this gives the opportunity to use such advantages of the modified cold-wall reactors, as high temperature uniformity and low temperature gradient near the substrate at elevated input precursor flow rates. We believe that this method increases the SiC growth rate significantly, while maintaining the high quality of the grown layers.

One embodiment shows silicon carbide growth rates vs. silane input flow rate in a modified reactor at: $T_{substrate}$=1600° C.; total pressure=200 Torr; silane flow rate=65 cc (10% in hydrogen); rotation rate=1000 rpm; main hydrogen flow rate=12500 cc; reactant push flow rate=1500 cc; and pyrometer opening purge=550 cc. Silane flow rate was varied from 20 to 65 cc (10% in hydrogen) and the halogenated carbon precursors input flow rate was taken to maintain the Si/C input ratio of 1.12.

One can see a significant increase in the silicon carbide growth rate.

In addition, in some applications, to get high quality material, we have used high temperatures, in the range of 1500-1800 Centigrade, with an excellent material characteristics.

An Example: Scale-Up to 3 Inch Wafers

It is well known from the reference data that the strains produced by temperature mismatch between the substrate and the growing epilayer are the main sources of wafer bow. Obviously, a decrease in the temperature gradient in the wafer region is an effective way to improve the layer quality. One approach to minimize the gradient is to decrease the growth temperature. However, this will significantly decrease the SiC growth rate. Another method is to improve temperature uniformity in the reactor, increasing wall and inlet temperatures. An additional advantage of such a method is the optimal precursor utilization. Indeed, thermal decomposition of silane, propane, and halogenated carbon precursors were shown to occur in a narrow hot zone near the wafer. An increase of this hot zone will provide the possibility of more effective precursor decomposition. In turn, this will lead to an additional increase in SiC growth rate.

The modified reactor design helps to increase the temperature uniformity, and to decrease temperature gradients near the wafer. It includes a spool-like graphite insert that replaces the water-cooled unit of a typical reactor. A shower head is also added near the inlet region. The gap between the reactor top flange and the insert, as well as the gap between the shower head and the insert's inner walls, are additional dimensions that can be adjusted for further optimization of the design, based on the specific gas and gas flow.

The effect of the reactor design modifications on the temperature distributions in the reactor bulk is demonstrated. One can see that the typical cold wall reactor is characterized by a hot zone localized in the vicinity of the susceptor. The addition of the graphite insert with the shower head in the inlet region gives an opportunity to make the temperature distributions more uniform. Note that the temperature scale is limited by 700° C., to clarify the sharp temperature gradient.

Proper transfer of the growth recipe to 3 inch wafers requires a careful tuning of all main growth parameters. Within this task, modeling is used to find the optimal flow rate and rotation rate, providing the stable, recirculation-free growth conditions in the reactor. The special attention should be paid to suppression of the recirculation near the reactor side walls that may spoil the uniformity in case of growth on large-diameter wafers.

The distribution of silicon and carbon precursors between the injection zones is adjusted, in order to ensure the necessary growth rate uniformity and preserve a high efficiency process.

Modification of the flow profile allows for the required doping and thickness uniformity, while modification of the temperature gradient potentially improves the wafer bow. One embodiment shows the temperature distribution in the reactor with 3" wafer placed on the susceptor. Of course, this technology can be applied to any size wafer.

An Example: Modification of Veeco's "GaNzilla" Reactor

The modifications in our cold-wall Veeco Ganzilla reactor provide the optimization of the temperature distributions, due to the introduction of the screen system, making the existing reactor close to hot-wall devices. As a result, the SiC growth rate will be increased, maintaining the high layer quality. We have applied the approach tested above for the Veeco Instruments reactor. It was shown that temperature distributions can be significantly improved in the modified geometry. The temperature gradient near the wafer is estimated as 15-20 K/mm. Note that these values can be further decreased during the optimization of the process parameters for a specific situation.

A point of essential interest in our modified "GaNZilla" reactor is a possibility to realize the regime with decreased input hydrogen flow. Obviously, this can be an important step to get an effective and low-cost process. A set of regimes was computed for the modified GaNZilla reactor. The regimes with the hydrogen flows decreased to 30 slm. Veeco's GaNzilla reactor is modified to accommodate 8×3" SiC wafers for thick epitaxial layer growth.

The effect of the screen system introduction was preliminary computed for GaNzilla reactor. One embodiment illustrates the effect of these modifications for the regime with substrate temperature of 1400° C. The hot zone in such modified reactor is significantly enlarged. (Screen system introduction significantly improves the temperature distributions in GaNZilla reactor.)

Thus, this invention helps/improves temperature uniformity, suppress phase nucleation, reducing Si clusters, reducing total flow rate, reducing defects, reducing mismatch and bow effect, improving morphology, improving deposition condition, improving quality, application for larger diameter wafers, and reducing depositions on graphite, among other results.

The system also accepts multiple substrates on the substrate holder.

The embodiments above are just for the purpose of clarification (as examples). However, the inserts/additions to the walls/setup/shower-head can be any shape, angled, orientations, size, any material, and at any position, as long as they can stand the environment inside chamber. The precursors can be any other chemical compound, element, or mixture, as long as the ratio, amount, or percentage of the decomposed species stay substantially the same or similar. In addition, the temperatures, flow rates, dimensions, and other design and growth parameters can be varied, as long as the main objectives of the invention, mentioned above, are more or less satisfied. It can also be applied to semiconductors other than SiC and its related compounds.

Any variations of the teachings above are also included and meant to be protected by the current patent application.

The invention claimed is:

1. A chemical vapor deposition system, said system comprising:
    an enclosure with walls;
    a substrate holder;
    a heating element near said substrate holder;
    an inlet for one or more gasses;
    a shower-head, located near said inlet;
    a cooled insert located near said shower-head and said inlet;
    a water cooling unit around said enclosure;
    a heat-shielding insert, attached to said cooled insert, at two ends of said heat-shielding insert;
    wherein said heat-shielding insert is located near said shower-head and said inlet.

2. The chemical vapor deposition system as recited in claim 1, wherein said heat-shielding insert is made of graphite.

3. A system as recited in claim 1, wherein said substrate holder holds a wafer or substrate of at least 3 inch in diameter.

4. A system as recited in claim 1, wherein said system comprises at least a refractory metal.

5. A system as recited in claim 4, wherein said at least a refractory metal is made of one or more of the following materials, or their alloys or mixtures: tantalum, niobium, titanium, tungsten, molybdenum, zirconium, or hafnium.

6. The chemical vapor deposition system as recited in claim 1, wherein said shower-head is made of one or more of the following materials, or their alloys or mixtures: graphite, SiC-coated graphite, graphite coated with carbides of refractory metals, carbides of refractory metals, quartz, quartz coated with refractory metals, or pure refractory metals.

7. A system as recited in claim 1, wherein said system is a semiconductor growth apparatus.

8. A system as recited in claim 1, wherein said system is a SiC growth apparatus.

9. A system as recited in claim 1, wherein said system holds multiple substrates.

* * * * *